(12) United States Patent
Bourgeat et al.

(10) Patent No.: US 9,299,668 B2
(45) Date of Patent: Mar. 29, 2016

(54) COMPACT ELECTRONIC DEVICE FOR PROTECTING FROM ELECTROSTATIC DISCHARGE

(71) Applicant: STMicroelectronics S.A., Montrouge (FR)

(72) Inventors: Johan Bourgeat, Allevard (FR); Philippe Galy, La Touvet (FR)

(73) Assignee: STMicroelectronics SA, Montrouge (FR)

( * ) Notice: Subject to any disclaimer, the term of this patent is extended or adjusted under 35 U.S.C. 154(b) by 670 days.

(21) Appl. No.: 13/705,503

(22) Filed: Dec. 5, 2012

(65) Prior Publication Data
US 2013/0155558 A1    Jun. 20, 2013

(30) Foreign Application Priority Data

Dec. 16, 2011  (FR) ...................................... 11 61797

(51) Int. Cl.
| | |
|---|---|
| *H02H 9/00* | (2006.01) |
| *H01L 23/60* | (2006.01) |
| *H01L 27/02* | (2006.01) |
| *H02H 9/04* | (2006.01) |

(52) U.S. Cl.
CPC ............. *H01L 23/60* (2013.01); *H01L 27/0274* (2013.01); *H02H 9/04* (2013.01)

(58) Field of Classification Search
USPC .......................................................... 361/56
See application file for complete search history.

(56) References Cited

U.S. PATENT DOCUMENTS

| | | | |
|---|---|---|---|
| 6,537,921 B2 | 3/2003 | Metzler | |
| 8,350,355 B2* | 1/2013 | Esmark | ......................... 257/520 |
| 9,019,666 B2* | 4/2015 | Bourgeat et al. | ................ 361/56 |
| 2002/0021538 A1 | 2/2002 | Chen et al. | |
| 2003/0035257 A1 | 2/2003 | Chen | |
| 2007/0273429 A1 | 11/2007 | Ribeiro Duarte | |
| 2009/0032838 A1 | 2/2009 | Tseng et al. | |
| 2010/0001347 A1 | 1/2010 | Sugiura | |
| 2010/0271741 A1* | 10/2010 | Galy et al. | ....................... 361/56 |
| 2013/0113017 A1* | 5/2013 | Galy | .................. H01L 27/0262 257/124 |
| 2013/0141824 A1 | 6/2013 | Bourgeat et al. | |

(Continued)

FOREIGN PATENT DOCUMENTS

| | | |
|---|---|---|
| EP | 2246885 A1 | 11/2010 |
| WO | WO-2011089179 A1 | 7/2011 |

OTHER PUBLICATIONS

Lim, W.L., et al: "Field-Effect Diode Based on Electron-Induced Mott Transition in $NdNiO_3$," Oct. 9, 2012, 5 pages.

(Continued)

*Primary Examiner* — Ronald W Leja
(74) *Attorney, Agent, or Firm* — Gardere Wynne Sewell LLP

(57) ABSTRACT

A device for protecting a set of N nodes from electrostatic discharges, wherein N is greater than or equal to three, includes a set of N units respectively possessing N first terminals respectively connected to the N nodes and N second terminals connected together to form a common terminal. Each unit includes at least one MOS transistor including a parasitic transistor connected between a pair of the N nodes and configured, in the presence of a current pulse between the pair of nodes, to operate, at least temporarily, in a hybrid mode including MOS-type operation in a sub-threshold mode and operation of the bipolar transistor.

14 Claims, 9 Drawing Sheets

(56) References Cited

U.S. PATENT DOCUMENTS

2013/0155558 A1* 6/2013 Bourgeat et al. ............... 361/56
2015/0077888 A1* 3/2015 Galy .................. H01L 29/7436
                                                            361/56

OTHER PUBLICATIONS

Sheikhian, Iraj et al: "An Improved Differential Comparator With Field Effect Diode Output Stage," World Scientific, Journal of Circuits, Systems, and Computers, vol. 14, No. 5 (2005) 931-937.

Taghibakhsh, Farhad: "The Field Effect Diode," Bahonar University of Kerman, dated unknown, pp. 236-237.

Bourgeat J et al: "Evaluation of the ESD Performance of Local Protections Based on SCR or Bi-SCR With Dynamic or Static Trigger Circuit in 32nm," Microelectronics and Reliability, Elsevier Science Ltd, GB, vol. 50, No. 9-11, Sep. 1, 2010, pp. 1379-1382.

Jang S-L et al: "Gate Coupled and Zener Diode Triggering Silicon-Controller Rectifiers for Electrostatic Discharge Protection Circuits," Solid State Electronics, Elsevier Science Publishers, Barking, GB, vol. 46, No. 2, Feb. 1, 2002, pp. 263-267.

INPI Search Report and Written Opinion for FR1161797 mailed May 30, 2012 (7 pages).

* cited by examiner

COMPACT ELECTRONIC DEVICE FOR PROTECTING FROM ELECTROSTATIC DISCHARGE

PRIORITY CLAIM

This application claims priority from French Application for Patent No. 1161797 filed Dec. 16, 2011, the disclosure of which is hereby incorporated by reference.

TECHNICAL FIELD

The invention relates to electronic devices, and especially to those intended to protect circuit nodes from electrostatic discharge (ESD), for example those incorporated in the input/output cells of an integrated circuit.

BACKGROUND

The use of advanced CMOS technologies, for example the use of 65 nanometer or sub-65 nanometer technologies, and in particular 45 or 32 nanometer technologies, leads to lower and lower supply voltages being used.

An electronic device for protecting from electrostatic discharge comprising a triac and triggering means employing MOS transistors capable, in the presence of a current pulse resulting for example from an electrostatic discharge, of operating in a hybrid mode including MOS-type operation in a sub-threshold mode and operation of the parasitic bipolar transistor, is described in International Patent Application No. PCT/EP2011/050740 (WO 2011/089179), the disclosure of which is hereby incorporated by reference.

The hybrid operating regime of a MOS transistor was demonstrated in the article by Galy, et al., "Ideal Gummel curves simulation of high current gain vertical NPN BIMOS transistor", Int. J. Electronics, 1996, Vol. 80 No. 6, 717-726, the disclosure of which is hereby incorporated by reference. This article is a theoretical study carried out on a transistor with a vertical structure having a gate length (channel length) of about a micron and validated by simulations, without any application whatsoever of such hybrid operation being mentioned. A four-terminal microelectronic component combining the bipolar effect and the MOS effect in a hybrid operating mode, in order to improve current gain, has also been described in French Patent No. 2,784,503, the disclosure of which is hereby incorporated by reference. Such a component is presented as being able to withstand ionizing radiation and it is specified, in a general way, that it may be employed in mass-market, aerospace and/or military applications in the digital and analog fields without any application whatsoever of the hybrid operation of the component being mentioned.

The aforementioned International Patent Application No. PCT/EP2011/050740 teaches that it is particularly beneficial to use this hybrid transistor operating regime especially to produce a device subjected to current pulses, in particular a device for protecting a component from electrostatic discharge, which discharge results in current pulses between two terminals of the device, the current pulses being caused by a pulsed voltage difference between these two terminals.

This hybrid operation is obtained when the transistor is configured so that the gate of the MOS transistor is biased with a voltage lower than its threshold voltage and when the voltage difference between the substrate and the source of the MOS transistor is positive. This positive voltage difference is for example obtained when the substrate of the MOS transistor, which forms the intrinsic base of the parasitic bipolar transistor, is biased with a non-zero voltage whereas the source of the MOS transistor is grounded.

Provided that the transistor configuration conditions required to obtain this hybrid operation are met, the latter may be observed for relatively large gate lengths, for example 1 micron, though, in this case, the hybrid operation is not particularly applicable industrially.

In contrast, with technology scaling, the base of the parasitic bipolar transistor becomes smaller, particularly for 65 nanometer or sub-nanometer technologies and even more particularly for sub-50 nanometer technologies, for example 45 nanometer and 32 nanometer technologies, making the parasitic bipolar behavior of the MOS transistor more important.

Significant sub-threshold-voltage operation of the MOS transistor and simultaneous operation of the parasitic bipolar transistor then becomes possible, at least temporarily at the start of the current pulse.

Furthermore, with such hybrid operation, the current gain of the bipolar transistor, controlled by the gate voltage of the MOS transistor, may become substantial, even reaching a value as high as twenty or more.

Thus, this hybrid operation allows such a device to be advantageously used as an effective means for triggering a triac providing protection from electrostatic discharge, thereby significantly reducing the triggering threshold of the triac from about 8 volts to about 5 volts.

SUMMARY

According to one aspect, a device is provided for protecting from electrostatic discharge, forming a particularly compact ESD protection network and offering completely symmetric ESD protection.

According to one aspect, a device is provided for protecting a set of N nodes from electrostatic discharge, N being 3 or more, the device comprising a set of N units respectively possessing N first terminals respectively connected to the N nodes and N second terminals connected together to form a common terminal.

Each unit comprises at least one MOS transistor including a parasitic transistor connected between its two terminals and configured, in the presence of a current pulse between the two terminals, to operate, at least temporarily, in a hybrid mode including MOS-type operation in a sub-threshold mode and operation of the bipolar transistor.

Thus, such a device has the advantage of being particularly compact and allowing, by virtue of a star connection, N nodes to be protected from electrostatic discharge, while still being reversible with respect to the direction of the ESD pulse so as to provide completely symmetric ESD protection.

Depending on the envisaged application, and in particular on the magnitude of the ESD pulse, the width of the MOS transistors of the units may be adjusted. This being so, in order to avoid increasing the width of the MOS transistors too much, it is preferable in certain cases, to connect the protection device to a triggerable element possessing at least one control electrode, for example a triac, connected between each node pair, the control electrodes of all the triggerable elements being connected to the common terminal.

In this case, the aforementioned units participate in the triggering of the triggerable elements, for example triacs.

Whatever the envisaged application (with or without triggerable element), the two units preferably have one and the same structure but this structure may take different forms, especially one of those described in the aforementioned International Patent Application No. PCT/EP2011/050740.

Thus, it is possible for the substrate and the gate of the MOS transistor to be allowed to float, or else for them to be connected together without the gate and without the substrate being directly connected to the corresponding first terminal. Two nodes are said to be "directly connected" or "directly coupled" when these two nodes are connected or coupled without an intermediate component being connected or coupled between them.

This is because, in this case, the bias that needs to be applied to the gate and substrate in order to obtain hybrid operation is provided in the presence of the current pulse via the drain-substrate and drain-gate capacitances.

More precisely, for submicron CMOS technologies, for example 250 nanometer technology, and even more significantly for sub-65 nanometer technologies, for example 45 nanometer technology, a MOS transistor with a floating substrate and gate or indeed a substrate and gate that are connected together without the gate and without the substrate being directly connected to the corresponding terminal, will pass, at least temporarily, into its hybrid operating mode in the presence of a current pulse resulting from an electrostatic discharge.

These embodiments are in particular, but not exclusively, applicable to transistors having thick gate oxides, for example gate oxides about 50 Angstroms in thickness.

This being so, such embodiments have a low triggering threshold, which may be inappropriate for certain applications. This is because, even if the device provides effective ESD protection, it may trigger more easily in the presence of an accidental current spike during operation of the component to be protected, powered between a voltage Vdd and ground for example, i.e., in the steady state.

This triggering threshold may then advantageously be controlled by a control circuit, for example comprising at least one resistor, which will contribute to controlling the value of the voltage applied to the substrate and/or gate of the transistor.

More precisely, according to another embodiment, it is furthermore also possible for each unit to comprise a control circuit configured, in the presence of a current pulse between the two terminals, to apply a first non-zero voltage to the substrate of the MOS transistor and a second voltage, lower than the threshold voltage, to the gate of the MOS transistor.

This control circuit is advantageously configured to apply a first voltage that is lower than a voltage limit corresponding to a source-substrate saturation voltage of the parasitic bipolar transistor.

Here again, the control circuit may be produced in various ways.

Thus, according to one embodiment, each unit comprises a MOS transistor having its first electrode coupled to the first terminal, its second electrode coupled to said common terminal, its gate coupled to its substrate without being directly coupled to the first terminal, and a resistive element coupled between the substrate of the first MOS transistor and the first terminal.

Such a structure allows the bipolar and MOS effects to be simultaneously combined and amplified while reducing leakage currents.

Moreover, with such a transistor configuration, the latter will pass, in the presence of an electrostatic discharge applied between the two terminals of the device, at least temporarily at the start of the electrostatic discharge, into its hybrid operating mode because the biases on the substrate and the gate at least temporarily meet the conditions for obtaining hybrid operation.

This being so, even if this hybrid operation is observed with such a configuration for one-micron technologies (gate length of 1 micron), it becomes increasingly more significantly beneficial, especially for ESD protection applications, as gate lengths decrease. Thus, such ESD protection devices have been produced in 250 nanometer technologies. These ESD protection devices have proved, moreover, to be particularly suited to advanced technologies, such as for example 65 nanometer technologies and sub-65 nanometer technologies, in particular 32 nanometer technology.

According to another aspect, an input/output cell is provided for the integrated circuit, comprising an input/output pad, a first supply terminal, a second supply terminal, and a protection device as described above intended to protect the input/output pad, the first supply terminal and the second supply terminal.

According to another aspect, an integrated circuit comprising at least one input/output cell as described above, is also provided.

BRIEF DESCRIPTION OF THE DRAWINGS

Other advantages and features of the invention will become apparent on examining the detailed non-limiting description of embodiments, and the appended drawings, in which.

DETAILED DESCRIPTION OF THE DRAWINGS

Figure 1:
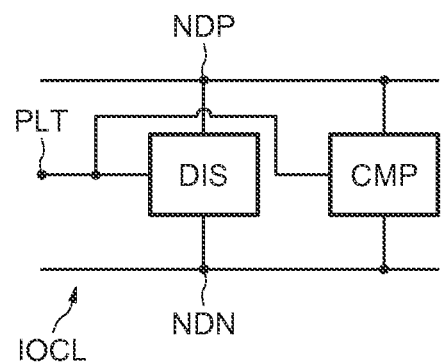
FIGS. 1 to 14 schematically illustrate various embodiments.

In FIG. 1, the reference DIS denotes an electronic device forming, in this embodiment, a device for protecting three nodes NDP, NDN and PLT, of an input/output cell IOCL of an integrated circuit.

A component CMP of the integrated circuit is, in this example, connected between the two terminals NDP and NDN, and to the input/output pad PLT.

Figure 2:
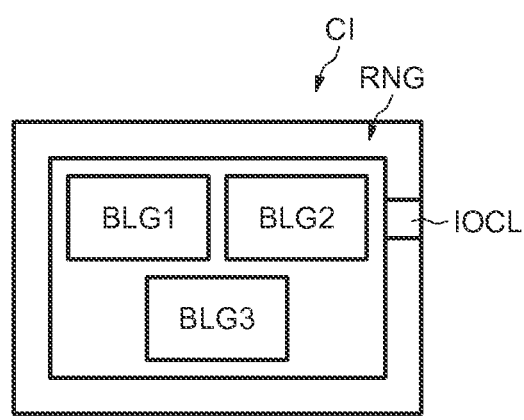

By way of non-limiting example, such input/output cells IOCL may be placed, as illustrated in FIG. 2, in a ring RNG on the periphery of the integrated circuit CI.

These cells IOCL may for example be used to transmit supply voltages and/or data signals to and/or from the functional units BLG1-BLG3 of the integrated circuit.

By way of indication, when the component CMP is operating, the terminal BP may be connected to a positive voltage Vp and the terminal BN may be connected to a negative or zero (ground) voltage Vn.

When the component CMP is not operating, it may be subjected to an electrostatic discharge typically taking the form of an ESD pulse having a pulse length in the range of 1 to 100 nanoseconds. Typically this corresponds, for example, to a pulsed voltage difference applied across two terminals of the cell generated via an equivalent RLC circuit, the peak voltage of which is reached after 100 nanoseconds with an HBM voltage of 1 to 4 kilovolts, for example, 4 kilovolts HBM for 2.5 amps.

It is recalled here that HBM is the acronym of the expression "human body model" well known to those skilled in the art in the field of electrostatic discharge protection and that HBM especially denotes an electrical circuit intended to model an electrostatic discharge delivered by a human being and commonly used to test the sensitivity of devices to electrostatic discharge. This HBM electrical circuit, which is the equivalent RLC circuit mentioned above, and to which a high voltage is applied, especially comprises a 100 picofarad capacitor that discharges through a 1.5 kiloohm resistor into the device to be tested. Thus, in the present case, an electrostatic discharge of 4 kilovolts HBM is understood to mean that a potential difference of 4 kilovolts is applied to the HBM electrical circuit.

This current pulse should then flow through the device DIS and not through the component CMP to be protected.

The device DIS therefore aims to absorb this current pulse and to prevent overvoltages across the terminals of the component CMP.

Figure 3:
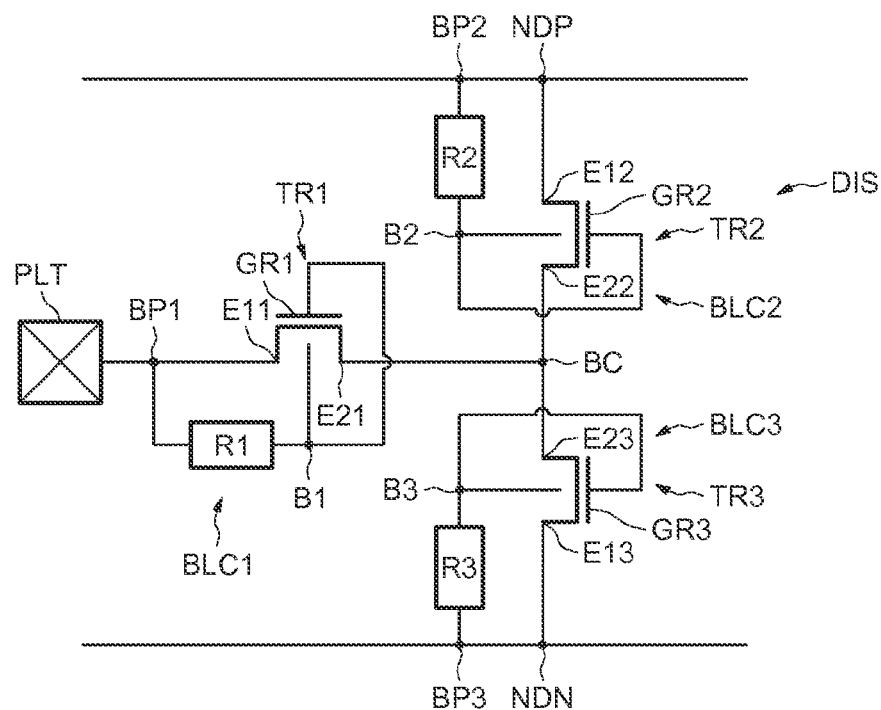

If FIG. 3 is now more particularly referred to, it may be seen that the device DIS here comprises three units BLC1-BLC3. Each unit comprises a first terminal BPi and a second terminal, all the second terminals of the units being connected together to form a common terminal BC.

The first terminals BP1-BP3 of the three units BLC1-BCL3 are respectively connected to three nodes to be protected, namely the node PLT, the node NDP and the node NDN.

Each unit PLCi comprises an nMOS transistor Tri, the first electrode Eli of which is connected to the terminal BPi, and the gate GRi of which is connected to the substrate Bi (also known, by those skilled in the art, as the "bulk") of the transistor without being directly connected to the terminal BPi.

Moreover, a resistive element Ri is connected between the substrate Bi of the transistor TRi and the terminal BPi.

The gate GRi is therefore connected to the terminal BPi only by way of the resistor Ri.

This device, as will be seen in more detail below, has a configuration that is reversible with respect to the polarity of the electrostatic discharge.

In the presence of a high potential on the terminal BP and a low potential on the terminal BC, i.e., corresponding to a current pulse delivered from the terminal BPi to the terminal BC, the electrode E1$i$ of the transistor TRi is its drain whereas the electrode E2$i$ of the transistor TRi is its source.

In the case of a reverse polarity, i.e., with a high potential on the terminal BC and a low potential on the terminal BPi, the second electrode E2$i$ of the transistor TRi forms the drain of this transistor, whereas the first electrode E1$i$ of this transistor forms its source.

Each transistor TRi includes a parasitic bipolar transistor, the collector of which corresponds to the drain D of the nMOS transistor, the emitter of which corresponds to the source S of the MOS transistor, and the base of which corresponds to the substrate B of the nMOS transistor.

Each transistor TRi is configured here, in the presence of a current pulse between the two terminals BP and BC, to operate at least temporarily in a hybrid mode that includes MOS-type operation in a sub threshold mode and operation of the parasitic bipolar transistor.

In this hybrid mode, the gate-source voltage $V_{GS}$ of the MOS transistor remains below the voltage threshold VT of the transistor, whereas a non-zero voltage $V_{BS}$ is applied between the substrate B and the source S of the transistor TRi in order to activate the parasitic bipolar transistor.

This being so, a voltage lower than a voltage limit is preferably applied to the substrate B of the transistor TRi in order to prevent saturation of the parasitic bipolar transistor. By way of indication, this voltage limit is here about 0.7 volts.

Thus, by applying a voltage to the substrate B of the transistor TRi, the parasitic bipolar transistor is activated whereas the current gain β of this parasitic bipolar transistor is controlled via the voltage applied to the gate of the transistor TR.

In the presence of a positive electrostatic discharge between the node PLT and the node NDN, i.e., leading to a positive potential difference between the terminal BP1 and the terminal BP3 (resulting in a current pulse delivered from the terminal BP1 to the terminal BP3) current flows, at the start of the pulse, through the resistor R1 and, when the voltage exceeds the threshold voltage of the diode (about 0.6 volts), through the forward-biased diode at the substrate-source junction (electrode E21) of the transistor TR1.

It should also be noted that, at least temporarily at the start of the pulse, the transistor TR1 passes into a hybrid operating mode especially because of the connection between the substrate B1 and the gate GR1.

The current pulse is therefore transmitted to the common terminal BC by way of the transistor TR1.

Thus, the transistor TR3 passes, at least temporarily at the start of the pulse, into its hybrid operating mode.

This is because the electrostatic discharge is transmitted by way of the drain-substrate capacitance $C_{DB}$ of the substrate of the transistor TR3 and by the drain-gate capacitance $C_{DG}$ of the gate of the transistor TR3.

The current pulse is converted by the resistor R3 into a substrate-source voltage $V_{BS}$ and into a gate-source voltage $V_{GS}$.

The presence of the capacitance $C_{DB}$, which is very high relative to the capacitance $C_{DG}$, and the connection between the substrate and the gate of the transistor TR3, allows the bipolar and MOS effects to be combined and amplified. This is because, since the capacitance $C_{DB}$ is very high relative to the capacitance $C_{DG}$, the pulse transmitted to the gate is smaller than that transmitted to the substrate. The presence of the connection between the gate and the substrate allows the gate to be more highly biased (by way of the pulse transmitted via the capacitance $C_{DG}$ and by way of the pulse transmitted through the substrate) and therefore these combined effects to be amplified, because the closer the gate voltage gets to the threshold voltage of the MOS transistor, the greater the increase in the current gain.

Moreover, the greater the product of R3 and $C_{DB}$, the lower the triggering voltage or threshold of the protection device.

Thus, depending on the technology used, the resistance of R3 will in particular be chosen so that the triggering threshold is acceptable and compatible with sub-threshold operation of the MOS transistor.

By way of indication, for a 40 nanometer technology (40 nanometer gate length), the capacitance $C_{DB}$ equals $1 \times 10^{-10}$ F/m and the capacitance $C_{DG}$ equals $1 \times 10^{-13}$ F/m.

For example R3 will be chosen to have a resistance of between 100 ohms and 100 kiloohms, for example 1000 ohms.

Of course, if the gate-source voltage of the transistor TR3 exceeds the threshold voltage of the MOS transistor, the latter passes into a MOS-type operating mode.

Of course, the reaction to a positive electrostatic discharge described above is identical for a negative electrostatic discharge, the roles of the transistors TR1 and TR3 being reversed and likewise the roles of the resistors R1 and R3.

Moreover, the reaction described above regarding an electrostatic discharge between the nodes PLT and NDN is equally applicable to an electrostatic discharge between the nodes PLT and NDP, the roles of the transistors TR1 and TR2 and the resistors R1 and R2 being identical to those just described for transistors TR1 and TR3 and R1 and R3, in the case of an electrostatic discharge between the nodes PLT and NDN.

Likewise, in the case of an electrostatic discharge between the nodes NDP and NDN, whatever the direction of this discharge, this time it is the transistors TR2 and TR3 and the resistors R2 and R3 that will operate analogously to transistors TR1 and TR3 and resistors R1 and R3.

In the steady state, i.e., when the component to be protected is operating, with for example a supply voltage Vdd on terminal BP2 and terminal BP3 grounded, the resistor R2 and the substrate-source junction of the transistor TR2 allow the potential of the common terminal BC to be pulled higher. Moreover, the substrate-drain junction of the transistor TR3 is reverse-biased when the potential of the substrate B3 of the transistor TR3 is pulled toward ground potential via the resistor R3. Thus, the gate GR3 is also pulled toward ground potential. The transistor TR3 is therefore turned off. The device DIS is therefore not triggered in the steady state.

Figure 4:
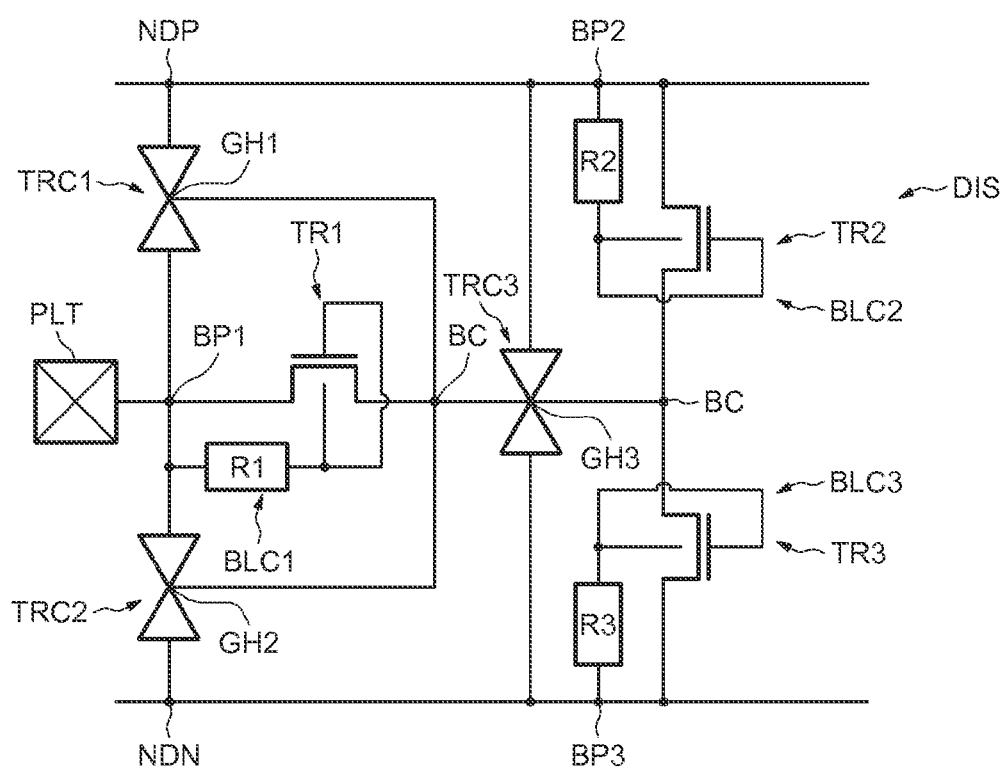

In the case where relatively large currents must be absorbed by the protection device DIS, it is particularly advantageous, as illustrated in FIG. 4, for the latter to furthermore comprise a number of triggerable elements, such as triacs TRCi, each possessing at least one control electrode or trigger GHi, and connected between each node pair. Thus, in the example illustrated in FIG. 4, since there are three nodes to be protected, there are three triacs TRC1-TRC3 connected between nodes NDP and PLT, PLT and NDN and NDP and NDN, respectively.

Moreover, the control electrodes, here the triggers GHi, of all the triggerable elements (triacs) TRCi are connected to the common terminal BC.

In the case of an electrostatic discharge between the node NDP and the node PLT (high potential on NDP and low potential on PLT), the electrostatic pulse propagates via the unit BLC2, as explained above, to the common terminal BC, then via the unit BLC1 to the pad PLT, as explained above. Therefore, the trigger GH1 of the triac TRC1 is pulled toward ground potential, thereby causing it to trigger. Most of the ESD pulse can then be transmitted through the triac TRC1. Specifically, by way of indication, a current of about 100 milliamps flows through the transistor TR2 of the unit BCL2 whereas a current of a few amps, typically two amps, flows through the triac, during the ESD pulse.

During an ESD pulse delivered from the node NDN to the node PLT, this time it is the units BLC3 and BLC1 that create, at the start of the ESD pulse, a ground path, causing the potential of the trigger GH2 of the triac TRC2 to be pulled towards ground potential and therefore the triac to be triggered.

During an ESD pulse delivered from the node PLT to the node NDP, the ESD pulse propagates towards the node NDP via the units BLC1 and BLC2, therefore causing the trigger of the triac TRC1 to be pulled towards ground potential and therefore the triac to be triggered.

For an ESD pulse delivered from the node NDN to the node NDP, it is the units BLC3 and BLC2 that will propagate this pulse to ground and cause the trigger GH3 of the triac TRC3 to be pulled towards the potential of this ground plane, and therefore the triac to be triggered.

For an ESD pulse delivered from the node NDP to the node NDN, this time it is the unit BLC2 and then the unit BLC3 through which the pulse propagates to ground, thereby causing the trigger GH3 of the triac TRC3 to be pulled towards ground potential and therefore the triac to be triggered.

Finally, for an ESD pulse delivered from the node PLT to the node NDN, it is the unit BLC1 and then the unit BLC3 that propogate the ESD pulse to ground, this time triggering the trigger GH2 of the triac TRC2, thereby allowing transmission of the ESD pulse since this is the shortest path.

Figure 5:
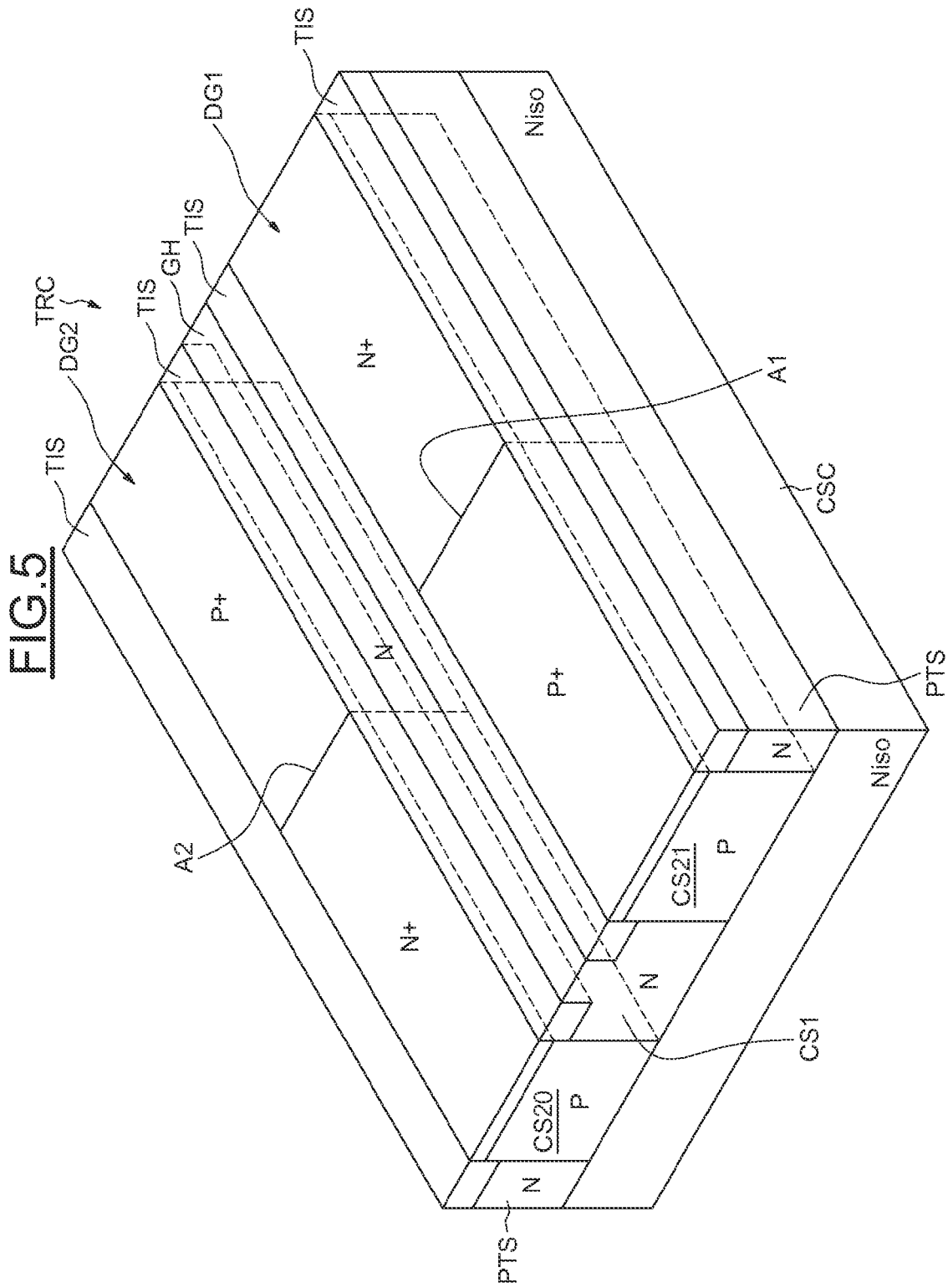

Although it is possible to use any type of triac, it is particularly advantageous, especially in terms of footprint, to use a triac with a single trigger, such as that illustrated in FIG. 5.

More precisely, in this example, the triac TRC with a single trigger GH comprises a first semiconductor well CS1 having a first conductivity type, for example n-type conductivity, forming the trigger GH of the triac, and two second semiconductor wells CS20 and CS21 having a second conductivity type of the opposite type to the first, here p-type conductivity. These two wells CS20 and CS21 are placed on either side of the first well CS1.

Moreover, an $n^+$-doped zone and a $p^+$-doped zone, located in mutual contact, both make contact with the well CS20 and form the electrode A2 of the triac TRC.

Likewise, a $p^+$-doped zone and an $n^+$-doped zone, located in mutual contact, both make contact with the second well CS21 and form the electrode A1 of the triac TRC.

The $p^+$-doped and $n^+$-doped zones are isolated from the first well CS1 by shallow trench isolation TIS.

Likewise, trench isolation TIS isolates the external sides of the $n^+$-doped and $p^+$-doped zones of the triac TRC.

Each pair of mutually facing ($n^+$-, $p^+$-) zones separated by the well CS1 forms, with the subjacent p-type and n-type layers, a half triac (thyristor).

Moreover, a buried semiconductor layer CSC (n-doped and commonly called a "NISO layer") makes contact with the first and second wells of the triac TRC. Regions PTS, doped n-type, are placed laterally with respect to the wells CS20 and CS21 and make contact with the buried layer CSC.

The triac, which is a double p-n-p-n structure, therefore comprises here two fingers DG1, DG2 respectively integrated into the semiconductor wells mentioned above.

Figure 6:
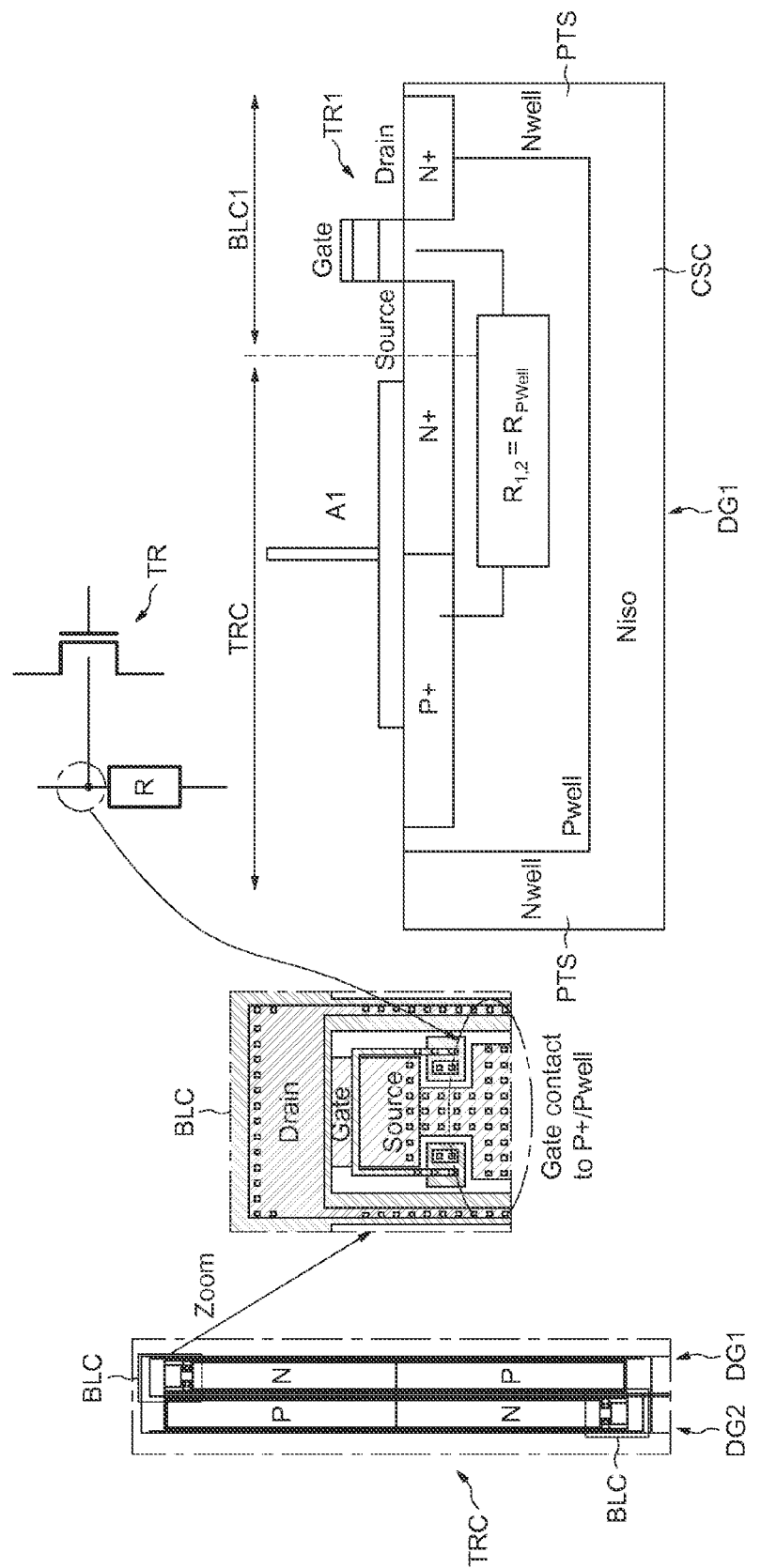

It is known, as illustrated in FIG. 6, especially from the aforementioned international patent application, to produce in a given finger, for example finger DG1, a half triac and the corresponding unit BLC.

More precisely, FIG. 6 shows, in the lower right-hand part, a half triac structure of the type illustrated in FIG. 5, with the transistor TR of the unit BLC at the end of the finger DG1. Furthermore, it will be observed here that the resistor R of the unit BLC is formed by the resistance of the well Pwell lying between the substrate of the transistor and the anode ($p^+$-doped zone) of the half triac.

Likewise, the gate is connected to this resistor R by a connection to a $p^+$-doped region of the well Pwell.

Figure 7:
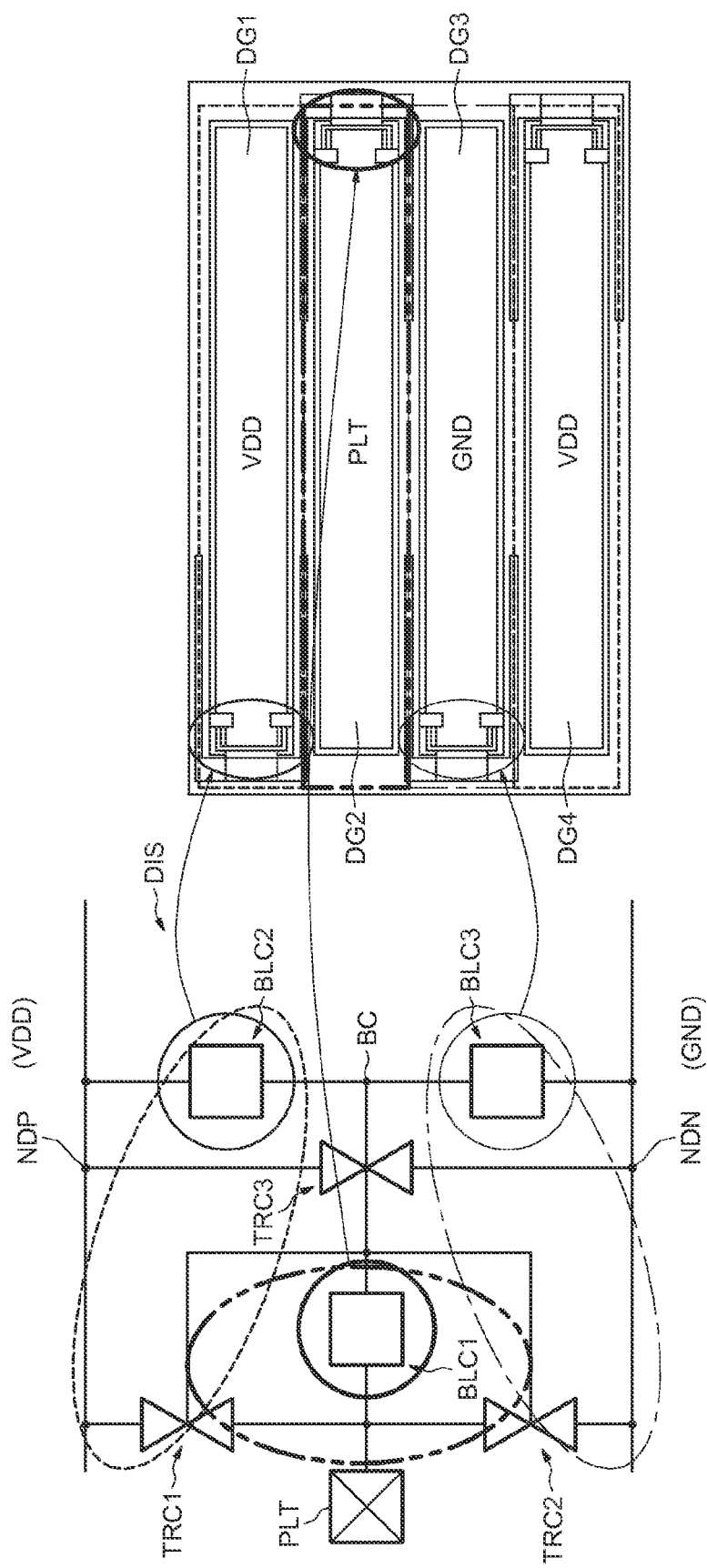

The embodiment in FIG. 7 shows a particularly compact on-silicon embodiment.

Specifically, as illustrated in this figure, the three triacs and the three units are integrated into four semiconductor fingers whereas in the prior art, six fingers would have been necessary to produce the three triacs.

More precisely, finger DG1 incorporates a half triac and the unit BLC2.

Finger DG2 incorporates a half triac and the unit BLC1.
Finger DG3 incorporates a half triac and the unit BLC3.
Finally, the fourth finger DG4 also contains a half triac.
Thus, the triac TRC1 is formed by the two fingers DG1 and DG2.

The triac TRC2 is formed by the two fingers DG2 and DG3 and the triac TRC3 is formed by the two fingers DG3 and DG4.

Of course, metallic connections, not shown here, allow the various triggers to be connected to the common terminal.

Although in the preceding embodiments, a particular embodiment was described for each unit BLCi, other embodiments of these units are possible.

Figure 8:
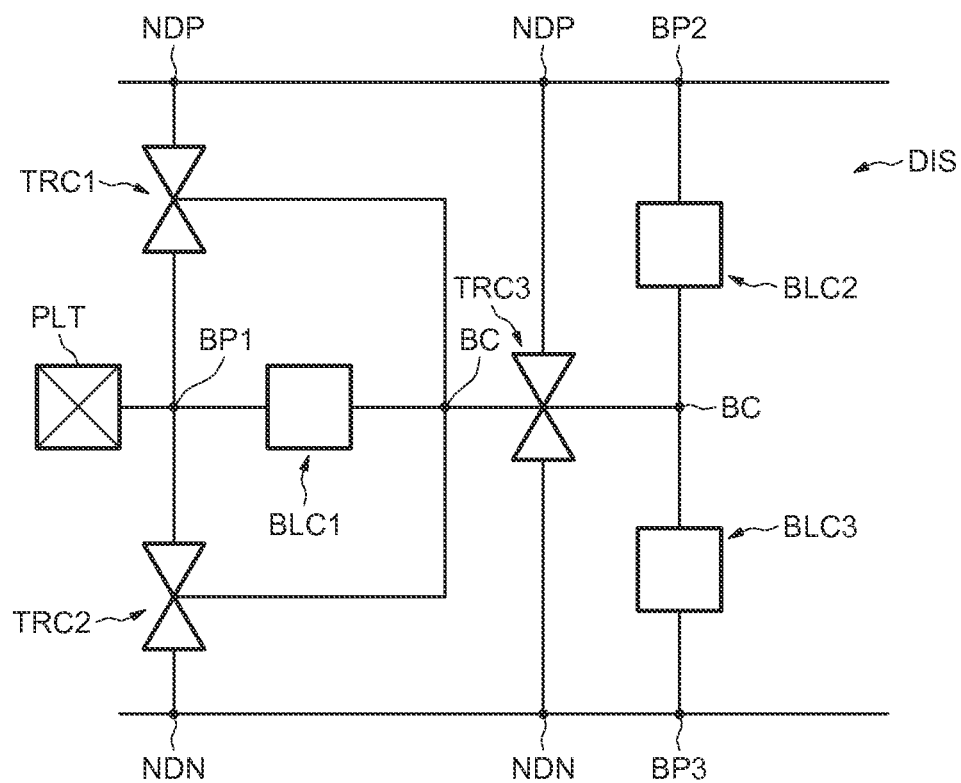

This is shown in a general way in FIG. 8, in a variant employing triacs. But this is also the case for a variant that does not employ triacs.

Thus the structure of each unit BLCi may be different provided that the structure employed allows the corresponding MOS transistor to at least temporarily operate in its hybrid mode in the presence of an ESD pulse and depending on the direction of the pulse.

Figure 9:
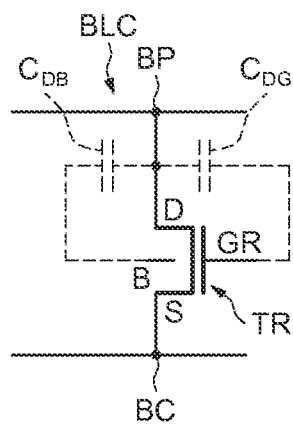

More precisely, as illustrated in FIG. 9, the substrate and the gate of the MOS transistor may be allowed to float. The bipolar and MOS effect is then obtained by capacitive coupling of the gate and substrate, via the capacitors $C_{DB}$ and $C_{DG}$. In FIG. 9, for the sake of simplicity, only the unit BLC has been shown and it has been assumed that the first electrode of the transistor TR is its drain D.

Figure 10:
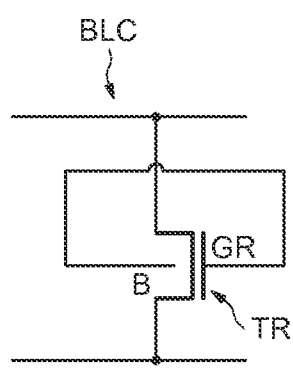

The gate GR and the substrate B of the transistor TR may furthermore be electrically connected, as illustrated in FIG. 10, in order to amplify the effect.

These embodiments are particularly advantageous for transistors TR with thick gate oxides, typically about 50 Angstroms in thickness.

This being so, these embodiments have very low triggering thresholds because the resistance between the substrate and ground (absence of connection between the substrate and ground) and between the gate and ground (absence of connection between the gate and ground) is very high. A very low triggering threshold may be unsuitable for certain applications, in particular when the component to be protected injects current into another component, because this injection may lead to untimely triggering of the device DIS.

This is why it is preferable to use the embodiments described earlier with a resistor between the substrate and the terminal BPi. This is because adjusting the resistance of this resistor allows the value of the triggering threshold to be increased.

Figure 11:
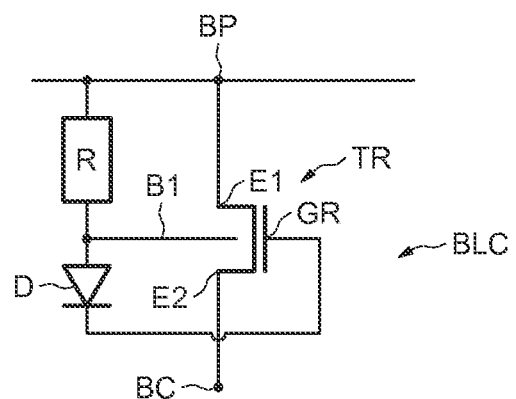

Another embodiment of the unit BLC is illustrated in FIG. 11. In this figure, it may be seen that the unit BLC comprises a diode D connected between the gate and the substrate of the transistor TR.

More precisely, the cathode of the diode is connected to the gate of the transistor, whereas the anode is connected to the substrate of the transistor and also to the resistor R.

This diode slows the discharge of the gate capacitance of the corresponding transistor after the ESD pulse has finished, thereby allowing the transistor TR to remain turned on for longer, and thereby considerably decreasing any spike in residual voltage after the pulse has finished.

Figure 12:
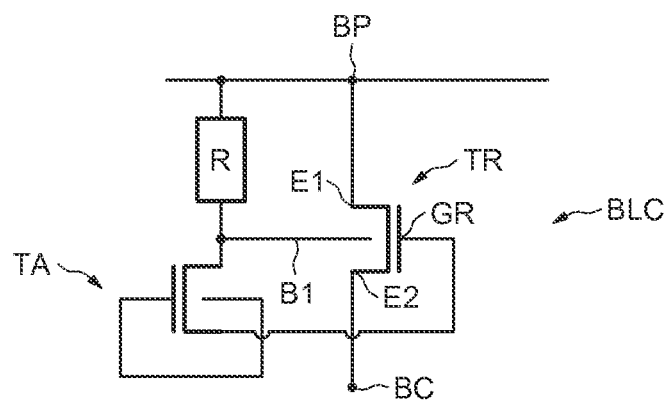

In FIG. 12, the diode has been replaced by an auxiliary transistor TA. The transistor TA is here an nMOS transistor having its gate connected to its substrate and a first electrode connected to the gate of the transistor TR, whereas the other electrode is connected to the resistive element R.

Such an additional transistor will therefore, during an ESD pulse, amplify the hybrid operation of the transistor TR and, after the ESD pulse has finished, slow the discharge of the gate capacitance of the transistor TR. In this embodiment, the amplification of the hybrid operation of the transistor TR is more rapid than in the embodiment in FIG. 11, because, in the embodiment in FIG. 11, the threshold voltage of the diode must be exceeded before the hybrid operation of the transistor TR can be amplified, whereas the presence of the additional transistor TA, which itself passes at least temporarily into its hybrid operating mode, allows the threshold voltage constraint to be bypassed and more rapid amplification to be achieved.

Figure 13:
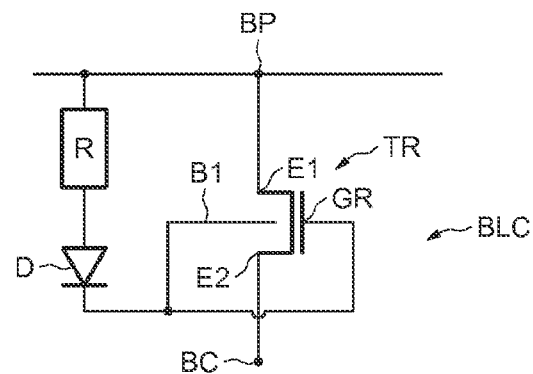

In the embodiment in FIG. 13, the additional element allowing the discharge of the gate capacitance to be slowed after the ESD pulse has finished, here a diode, is now connected between the substrate of the corresponding transistor and the corresponding resistive element.

More precisely, the cathode of the diode D is connected to the substrate of the transistor TR, and the anode is connected to the resistor R.

Moreover, the transistor TR has its substrate directly connected to its gate.

Because of this direct connection between the substrate and the gate, the hybrid operation of the corresponding transistor is therefore amplified during an ESD pulse. Moreover, the diode again allows the discharge of the gate capacitance of the transistor to be slowed after the ESD pulse has finished. Furthermore, this capacitance will now discharge into the substrate of the transistor, thereby contributing to the hybrid operation of the transistor after the ESD pulse has finished and especially allowing a more rapid dissipation of the ESD discharge. In other words, in this embodiment, a combined MOS/bipolar effect is obtained for the transistor TR at the start of the ESD pulse and at the end of the ESD pulse.

As a variant, the diode D could be replaced with an auxiliary transistor TA such as that illustrated in FIG. 12.

The above description regarding three nodes may be generalized to N nodes where N is 3 or more.

Figure 14:
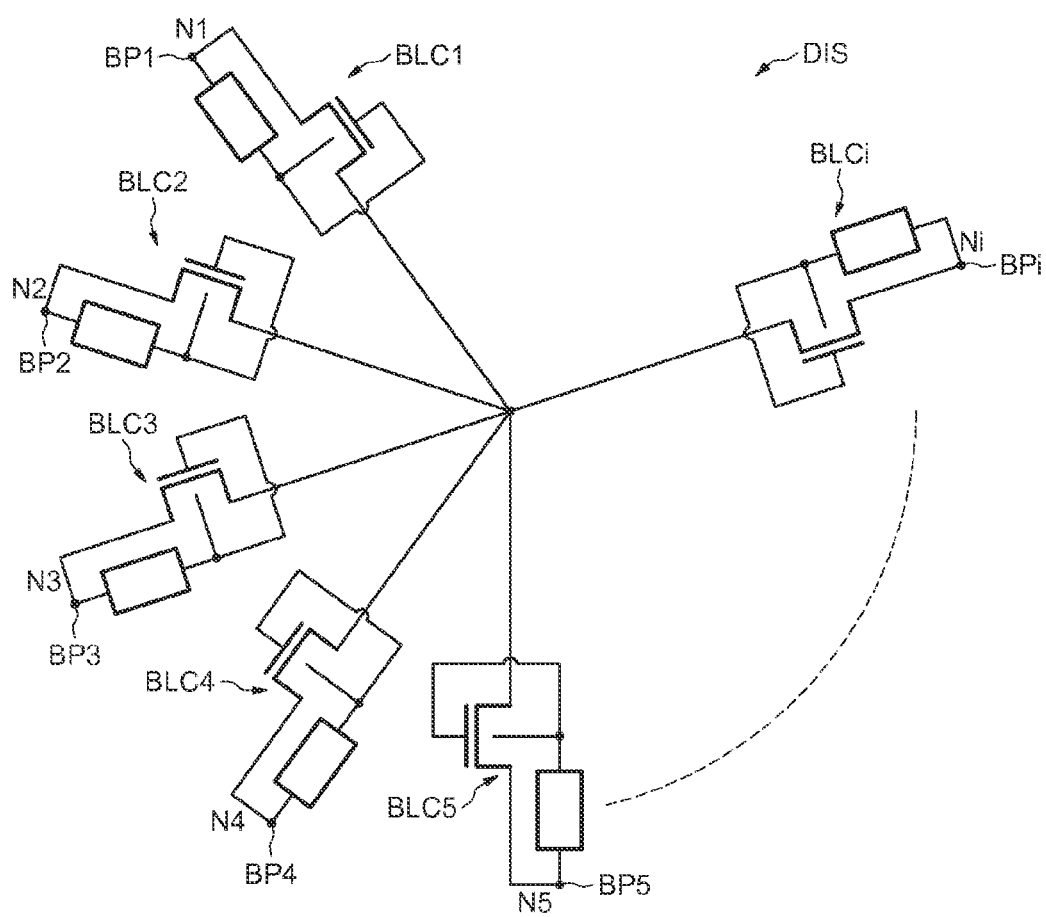

This is schematically illustrated in FIG. 14, where the device DIS is used to protect i nodes N1-Ni using a star protection network in which all the units BLCi are, on the one hand, respectively connected to the various nodes, and on the other hand, to a common terminal BC.

In the exemplary embodiment in FIG. 14, the structure of each unit BLCi is analogous to that described above, especially with reference to FIG. 3.

Of course, any other structure could be used for the units BLCi, such as for example that described with reference to FIGS. 9 to 13.

Likewise, the device DIS may be complemented by adding triggering elements, such as triacs, thereto, by connecting a triac between each node pair and by connecting all the control electrodes (triggers) of these triacs to the common terminal BC.

Of course, although in the examples described above, nMOS transistors were used, the invention is equally applicable to pMOS transistors.

Moreover, the invention just described is applicable to any type of integrated technology, whether it is bulk-substrate technology or even a silicon-on-insulator (SOI) technology.

By way of indication, the reduction in footprint obtained by the protection device according to the invention is about 30% relative to a conventional device, with a simplified triggering circuit when triacs are used.

What is claimed is:

1. A device for protecting a set of N nodes from electrostatic discharge, N being three or more, comprising:
    a set of N units respectively possessing N first terminals respectively connected to the N nodes and N second terminals connected together to form a common terminal,
    wherein each unit comprises at least one MOS transistor including a parasitic transistor connected between two terminals of the MOS transistor and configured, in the presence of a current pulse between the two terminals, to operate, at least temporarily, in a hybrid mode including MOS-type operation in a sub-threshold mode and operation of the bipolar transistor.

2. The device according to claim 1, wherein the MOS transistor has a first electrode coupled to the first terminal, a second electrode coupled to said common terminal, a gate coupled to a substrate of the MOS transistor without being directly coupled to the first terminal, and a resistive element coupled between the substrate of the MOS transistor and the first terminal.

3. The device according to claim 1, further comprising a triggerable element possessing at least one control electrode that is connected between each pair of nodes in the set of nodes, the control electrodes of all the triggerable elements being connected to said common terminal.

4. The device according to claim 3, for protecting three nodes, in which each triggerable element is a triac comprising two fingers, and the six fingers of the three triacs and the three units are integrated into four semiconductor wells.

5. The device according to claim 1, in which a gate length of each MOS transistor is less than 1 micron.

6. An ESD circuit, comprising:
a first MOS transistor coupled between a first supply node and a common node, the first MOS transistor having a gate terminal connected to a bulk of the first MOS transistor without a direct connection to said first supply node;
a second MOS transistor coupled between a second supply node and the common node, the second MOS transistor having a gate terminal connected to a bulk of the second MOS transistor without a direct connection to said second supply node; and
a third MOS transistor coupled between an input-output node and the common node, the third MOS transistor having a gate terminal directly connected to a bulk of the third MOS transistor without a direct connection to said input-output node.

7. The ESD circuit of claim 6, further comprising a first triac coupled between the input-output node and the first supply node, said first triac having a control terminal coupled to the common node.

8. The ESD circuit of claim 7, further comprising a second triac coupled between the input-output node and the second supply node, said second triac having a control terminal coupled to the common node.

9. The ESD circuit of claim 8, further comprising a third triac coupled between the first supply node and the second supply node, said third triac having a control terminal coupled to the common node.

10. The ESD circuit of claim 6, wherein the gate terminal and bulk of the first MOS transistor are indirectly connected to said first supply node through a resistor.

11. The ESD circuit of claim 6, wherein the gate terminal and bulk of the first MOS transistor are indirectly connected to said first supply node through a series connection of a resistor and diode.

12. The ESD circuit of claim 6, wherein the gate terminal is directly connected to the bulk of the first MOS transistor.

13. The ESD circuit of claim 6, wherein the gate terminal is connected to the bulk of the first MOS transistor through a diode.

14. The ESD circuit of claim 6, wherein the gate terminal is connected to the bulk of the first MOS transistor through a source-drain path of an additional MOS transistor, wherein a gate of the additional MOS transistor is directly connected to a bulk of the additional MOS transistor.

* * * * *